US006949388B2

(12) United States Patent
Park (10) Patent No.: US 6,949,388 B2
(45) Date of Patent: Sep. 27, 2005

(54) CMOS IMAGE SENSOR INTEGRATED TOGETHER WITH MEMORY DEVICE (75) Inventor: Sang Hoon Park, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 133 days.

(21) Appl. No.: 10/436,564

(22) Filed: May 12, 2003

(65) Prior Publication Data
US 2003/0197238 A1 Oct. 23, 2003

Related U.S. Application Data (62) Division of application No. 09/342,343, filed on Jun. 29, 1999, now Pat. No. 6,563,187.

(30) Foreign Application Priority Data
Jun. 29, 1998 (KR) .............................. 98-24711

(51) Int. Cl.[7] .......................... H01L 21/00; H01L 21/84
(52) U.S. Cl. ........................ 438/24; 438/30; 438/149; 438/154; 438/164
(58) Field of Search .............................. 438/24–26, 30, 438/149, 152–155, 164; 257/291–293, 444, 446

(56) References Cited
U.S. PATENT DOCUMENTS 5,225,696 A   7/1993 Bahraman
5,341,324 A * 8/1994 Matsumoto et al. .......... 365/51
5,461,425 A   10/1995 Fowler et al.
5,614,744 A   3/1997 Merrill
5,665,959 A   9/1997 Fossum et al.
5,694,143 A   12/1997 Fielder et al.
5,708,263 A   1/1998 Wong
5,841,159 A   11/1998 Lee et al.
6,066,090 A   5/2000 Yoon
6,316,787 B1 * 11/2001 Ohtani ........................ 257/59
6,445,014 B1  9/2002 Rhodes et al.

FOREIGN PATENT DOCUMENTS
WO          WO 97/24728        7/1997

* cited by examiner

Primary Examiner—Hsien-Ming Lee
(74) Attorney, Agent, or Firm—Townsend and Townsend and Crew LLP (57) ABSTRACT The present invention relates to a CMOS (Complementary Metal Oxide Silicon) image sensor; and, more particularly, to an image sensor integrated into one chip, together with a memory. The CMOS image sensor according to the present invention comprises: a pixel array formed on a chip, having a plurality of unit pixels; a logic circuit formed on the chip to process signals form the pixel array; and a memory formed on the chip to store outputs from the logic circuit, wherein the pixel array, the logic circuit and the memory are isolated from each other by insulating layers, whereby the pixel array, the logic circuit and the memory are integrated on the same chip.

40 Claims, 11 Drawing Sheets

CMOS IMAGE SENSOR INTEGRATED TOGETHER WITH MEMORY DEVICE

This patent application is a division of U.S. patent application Ser. No. 09/342,343, filed Jun. 29, 1999 now 6,563,184, incorporated herein in its entirety.

FIELD OF THE INVENTION

The present invention relates to a CMOS (Complementary Metal Oxide Silicon) image sensor; and, more particularly, to an image sensor integrated into one chip, together with a memory.

DESCRIPTION OF THE PRIOR ART

Generally, a CCD (charge coupled device) image sensor has many demerits in that complicated operation methods, large power consumption and a number of mask processes are required. Furthermore, it is very difficult to make a signal processing circuit integrated into a CCD chip. Accordingly, in order to overcome such demerits, many developments for a CMOS image sensor have been recently unsued using a submicron CMOS manufacturing technique. A CMOS image sensor creates a picture by detecting signals from photodiodes and MOS transistors formed within a unit pixel. The use of a CMOS manufacturing technique can reduce power consumption. Compared with a CCD, which requires 30 to 40 mask processes, the CMOS image sensor only approximately 20 mask processes are required, thereby simplifying the manufacturing process. Furthermore, since an image signal processing circuit is integrated together with light sensing elements in one chip, it is highlighted as a next generation image sensor.

The integration of a pinned photodiode and a CMOS circuit is disclosed in U.S. Pat. No. 6,184,056, titled "CMOS Image Sensor with Equivalent Potential Diode and Method for Fabricating the Same." More specifically, U.S. Pat. No. 6,184,056describes a method for maximizing the production and quantum efficiency of photoelectric charges generated by incident light and the transfer efficiency to transfer the photoelectric charges to a sensing node is disclosed.

On the other hand, U.S. Pat. No. 5,459,508, entitled "Image Processing Apparatus," discloses an apparatus for electrically recording image data, by implementing a memory control system which stores data outputted from image sensors in DRAM chips of, at least, more than 1.

However, in the conventional image sensor, since memories, such as DRAMs, and the image sensors are manufactured on different chips from each other, the use of the separate chips makes the miniaturization of the image system difficult, manufacturing cost more expensive, despite the use of a CMOS manufacturing technique, and even the power consumption is not remarkably reduced.

SUMMARY OF THE INVENTION

It is, therefore, an object of the present invention to provide a CMOS image sensor integrated together with a memory device in order to minimize a system to which the CMOS image sensor is applied and reduce the cost and power consumption.

In accordance with an aspect of the present invention, there is provided a CMOS image sensor comprising: a pixel array formed on a chip, having a plurality of unit pixels; a logic circuit formed on the chip to process signals from the pixel array; and a memory formed on the chip to store outputs from the logic circuit, wherein the pixel array, the logic circuit and the memory are isolated from each other by insulating layers, whereby the pixel array, the logic circuit and the memory are integrated on the same chip.

In accordance with another aspect of the present invention, there is provided a CMOS image sensor comprising: a chip divided into first to third sections; a unit pixel array formed on the first section; a logic circuit formed on the second section to process signals form the pixel array; and a memory formed on the third section to store outputs from the logic circuit, wherein the first to third sections are isolated from each other by insulating layers.

BRIEF DESCRIPTION OF THE DRAWINGS

Other objects and aspects of the invention will become apparent from the following description of the embodiments with reference to the accompanying drawings, in which:

FIGS. 2A to 2J are cross-sectional views illustrating a chip on which a CMOS image sensor and a DRAM are integrated in accordance with the present invention.

DETAILED DESCRIPTION OF THE INVENTION

Hereafter, the present invention will be described in detail with reference to the accompanying drawings.

Figure 1:
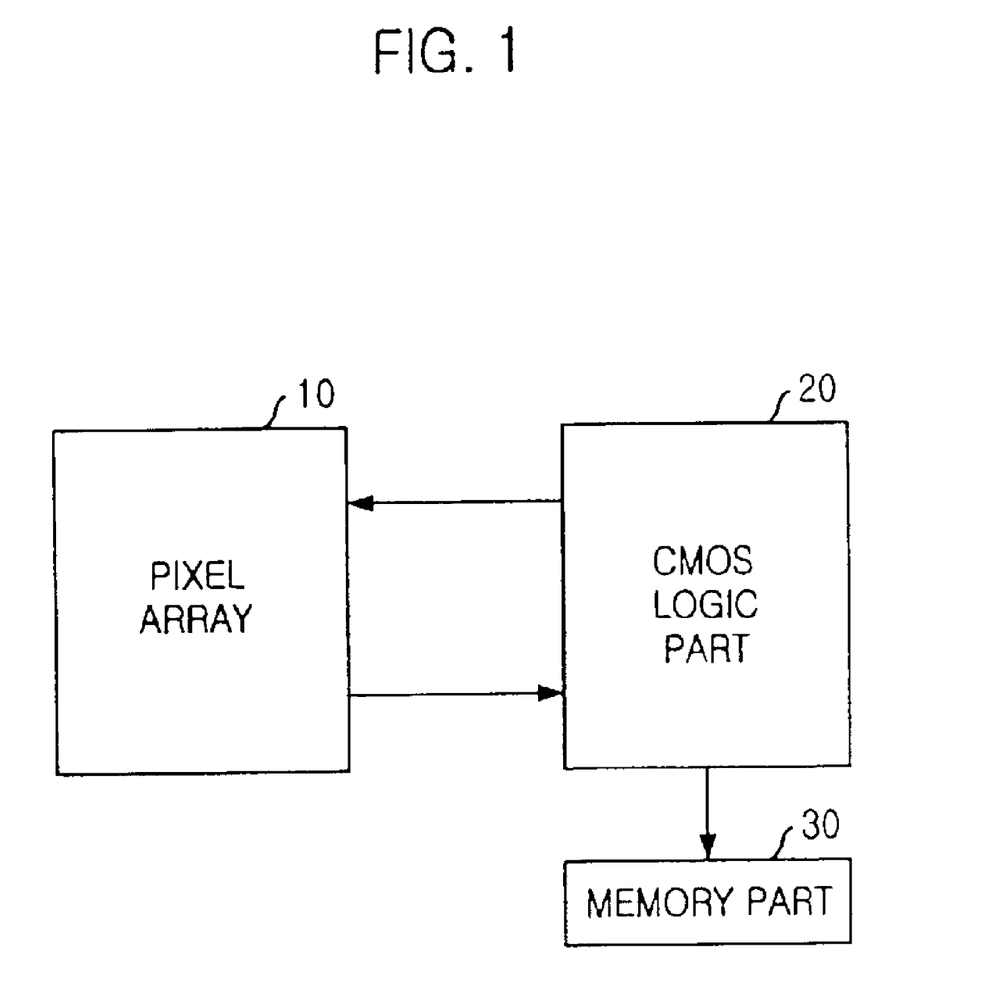
FIG. 1 is a schematic diagram illustrating a CMOS image sensor in accordance with the present invention.

FIG. 1 is a schematic diagram illustrating a CMOS image sensor in accordance with the present invention. As illustrated in FIG. 1, a CMOS image sensor in accordance with the present invention includes a pixel array 10 where pixels having photodiodes are arrayed, a CMOS logic part 20 for controlling the pixel array 10 and processing output signal from the pixel array 10 and a memory part 30 for storing image data processed in the CMOS logic part 20. The pixel array 10, the CMOS logic part 20 and the memory part 30 are integrated into one chip. Also, the memory part 30 may be composed of DRAMs or SRAMs.

FIGS. 2A to 2J are cross-sectional views illustrating a chip on which a CMOS image sensor and a DRAM are integrated in accordance with the present invention. In order to simplify the explanation, a pixel array, a CMOS logic part and a memory part are respectively shown in FIGS. 2A to 2J and each of them occupies a specific area on the one chip.

Figure 2A:
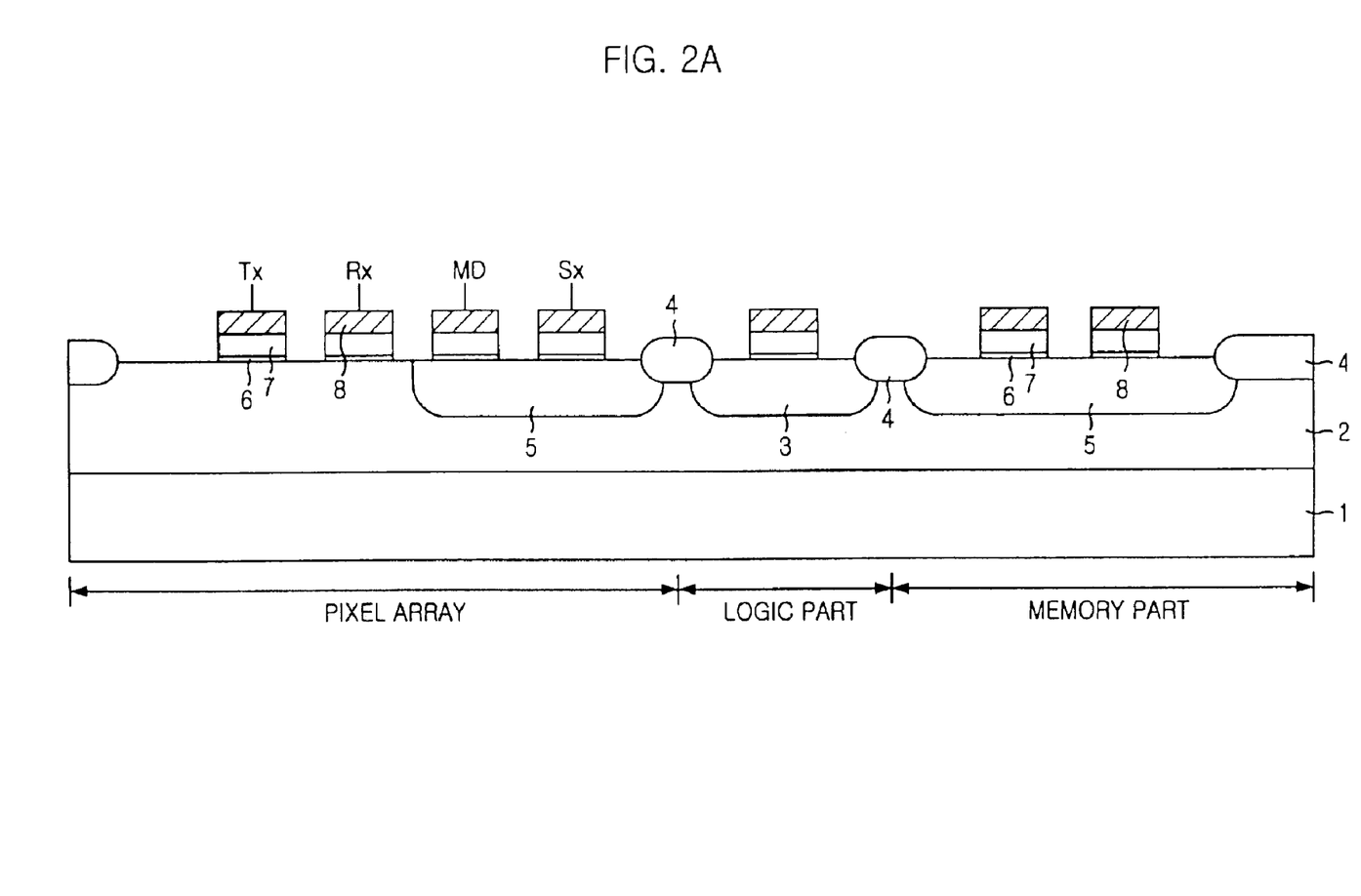

First, referring now to FIG. 2A, a P well 5 is formed in a P type epitaxial silicon layer 2 having a resistance of approximately 10 to 100 Ωcm. In addition, the P type epitaxial silicon layer 2 is formed on a silicon substrate 1 and, typically, a concentration of the P type epitaxial silicon layer 2 is lower than that of a silicon substrate 1. An N-well 3 is formed in the CMOS logic part, by ion-implanting P-type impurities into the P type epitaxial silicon layer 2 in conditions of an energy of approximately 1 to 2 KeV and a dose of 7E12 to 1E14 ions/cm$^2$. Field oxide layers 4 are formed to a thickness of approximately 3,000 to 5,000 Å in order to isolate elements from each other. Subsequently, P-wells 5 are formed in the pixel array and memory part, by ion-implanting B atoms in conditions of energy of approximately 100 to 500 KeV and a dose of 1E12 to 1E14 ions/cm$^2$. Next, gate oxide layers 6 and gate electrodes 7 are formed by carrying out the thermal treatment process at approximately 950° C. for around 30 minutes, and mask oxide layers 8 are also formed on the gate electrodes 7. A doped polysilicon layer and various kinds of silicide layers may be used as a conducting layer for the gate electrodes 7. These typical transistors are well-known to those skilled in the art, so further explanation will be omitted in the present invention.

Figure 2B:
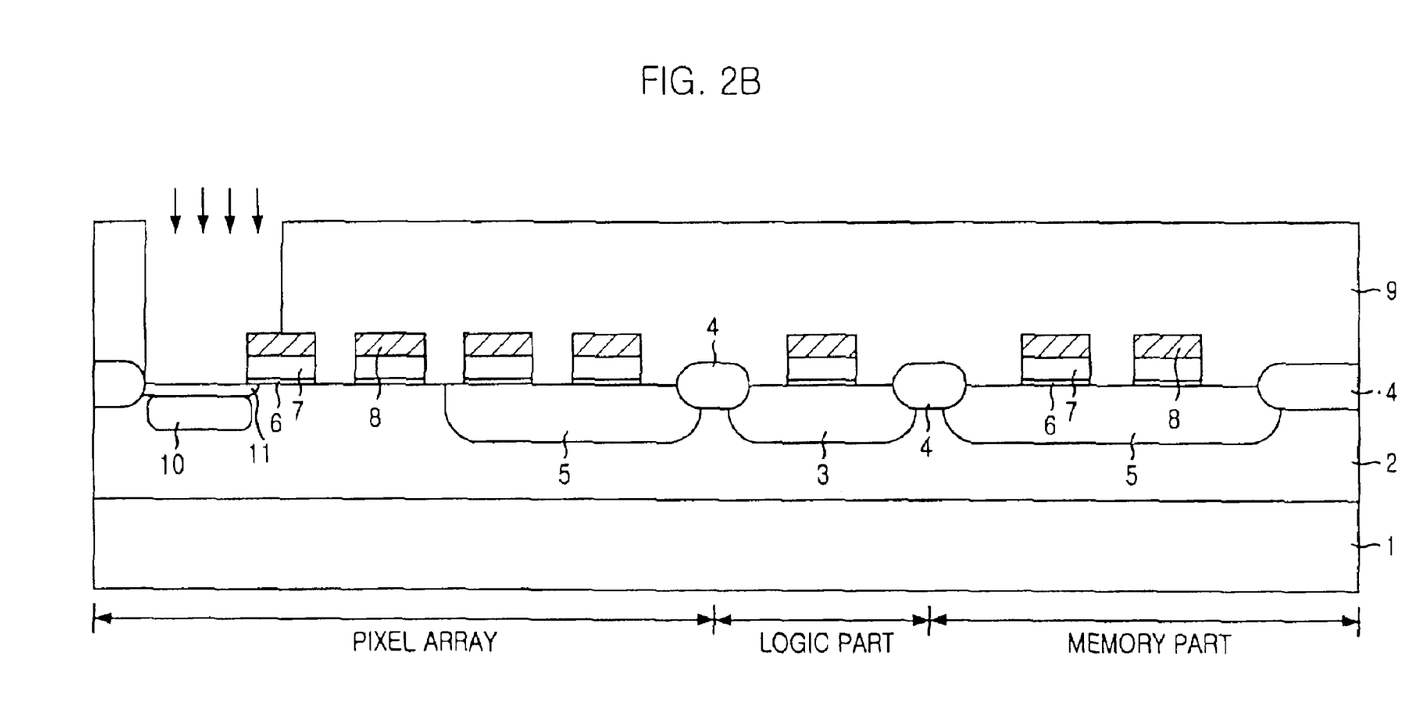

Referring to FIG. 2B, a first photoresist pattern 9 used as an ion implanting mask is formed, exposing a light sensing area in which the pinned photodiode is formed. At this time, an edge of the first photoresist pattern 9 is positioned on one (neighboring gate electrode) of the gate electrodes 7 so that the pinned photodiode is self-aligned to the neighboring gate electrode. Next, an N$^-$ region 10 is formed by ion-implanting P atoms into the high sensing area in conditions of an energy of approximately 150 to 500 KeV and a dose of 3E12 to 5E12 ions/cm$^2$, using the first photoresist pattern 9 and mask oxide pattern 8 as ion implantation masks and further, a P$^0$ region 11 is formed by ion-implanting BF$_2$ in conditions of an energy of approximately 20 to 40 KeV and a dose of 1E13 to 3E13 ions/cm$^2$. In the preferred embodiment of the present invention, an additional ion implantation mask may be needed to form the P$^0$ region 11. By portioning a portion of the P$^0$ region 11 on the P type epitaxial silicon layer 2, the N$^-$ region 10 is fully depleted at low voltage. This concept is disclosed in the above mentioned U.S. patent application Ser. No. 09/258,814.

Figure 2C:
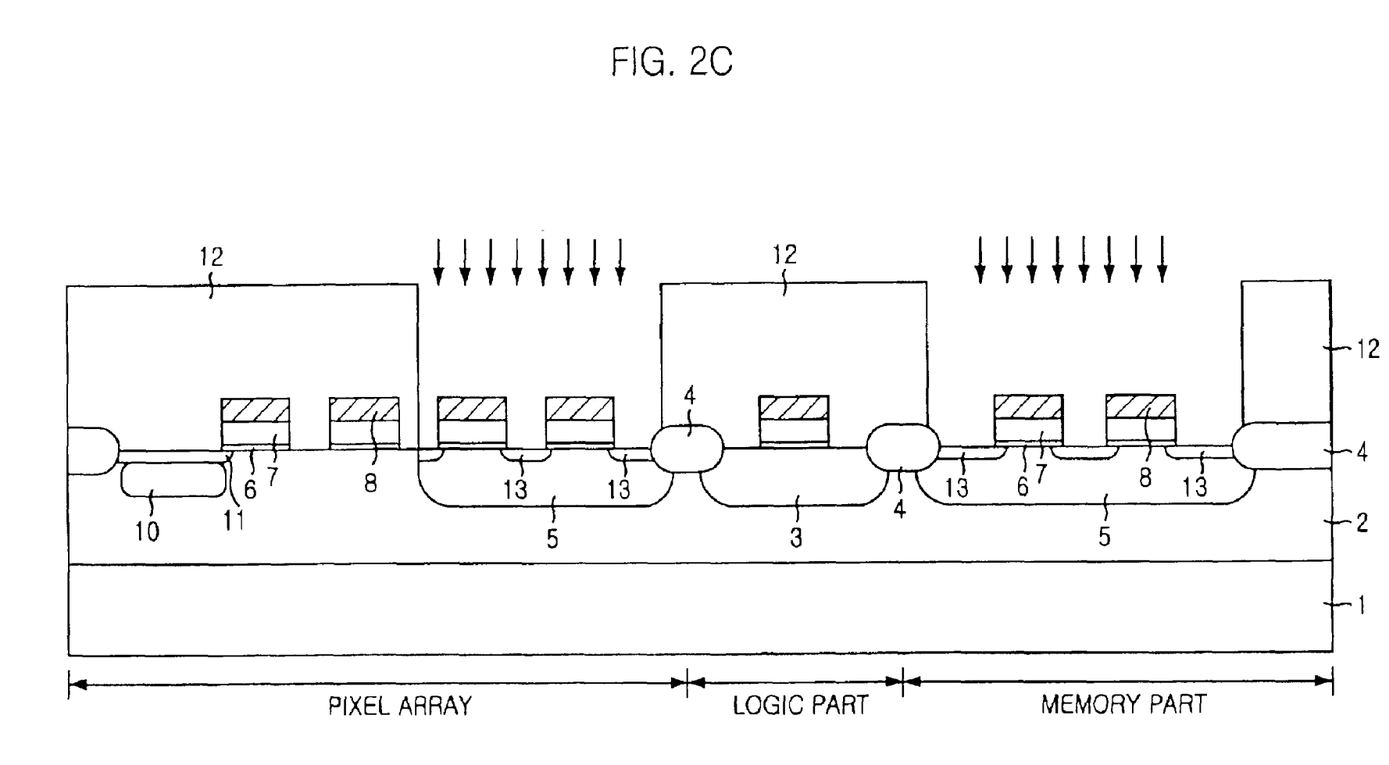

Next, referring to FIG. 2C, after removing the first photoresist layer pattern 9, a second photoresist layer 12 exposing the P-well regions 5 is formed and N$^-$ LDD (Lightly Doped Drain) regions 13 are formed by ion-implanting P atoms into the P-well regions 5 in conditions of an energy of approximately 10 to 60 KeV and a dose of 1E13 to 5E13 ions/cm$^2$.

Figure 2D:
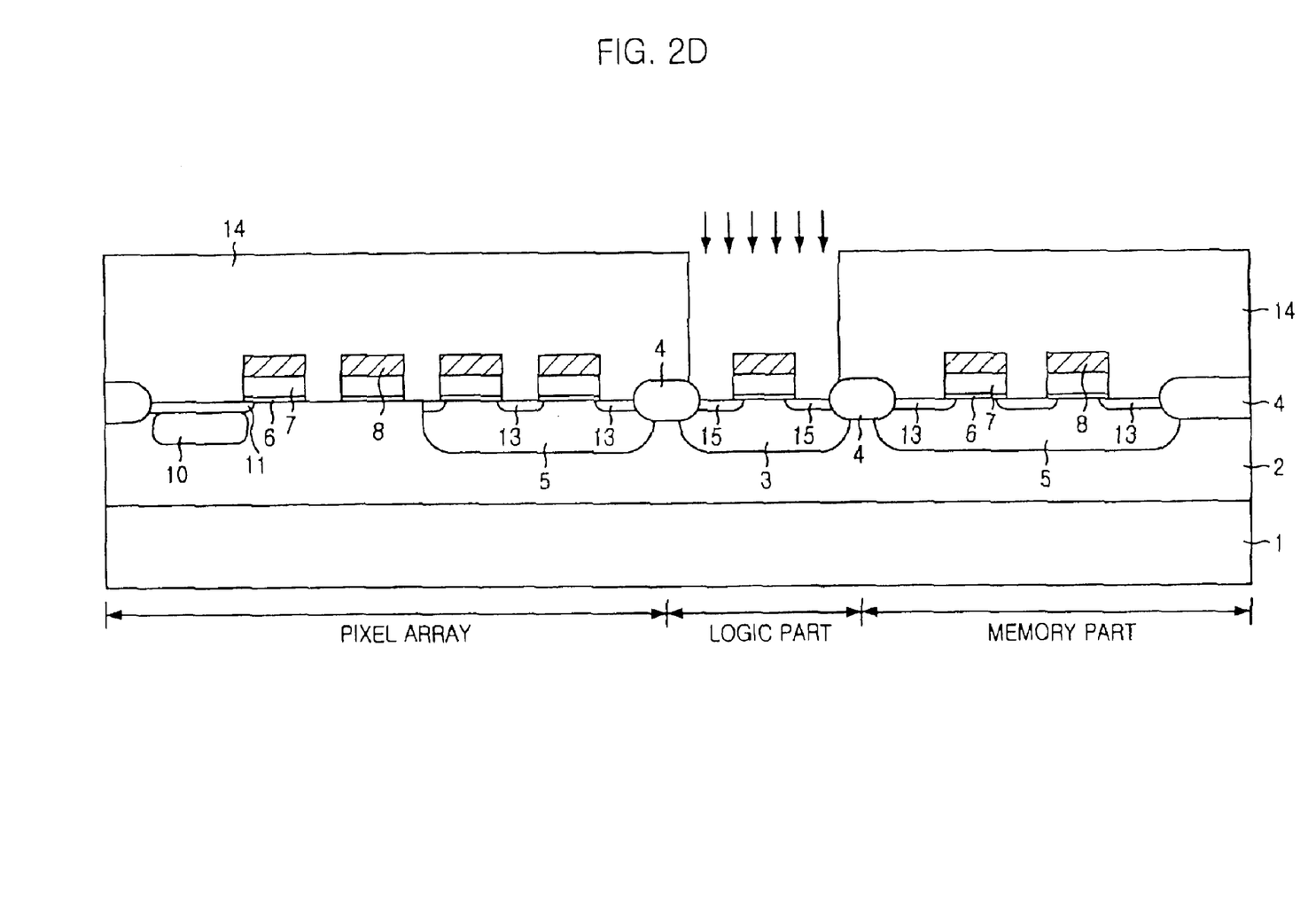

Referring to FIG. 2D, after removing the second photoresist layer pattern 12, a third photoresist layer 14 exposing the N-well region 3 is formed and P$^-$ LDD (Lightly Doped Drain) regions 15 are formed by ion-implanting N-type atoms into the N-well region 3 in conditions of an energy of approximately 20 to 60 KeV and a dose of 1E13 to 5E13 ions/cm$^2$.

Figure 2E:
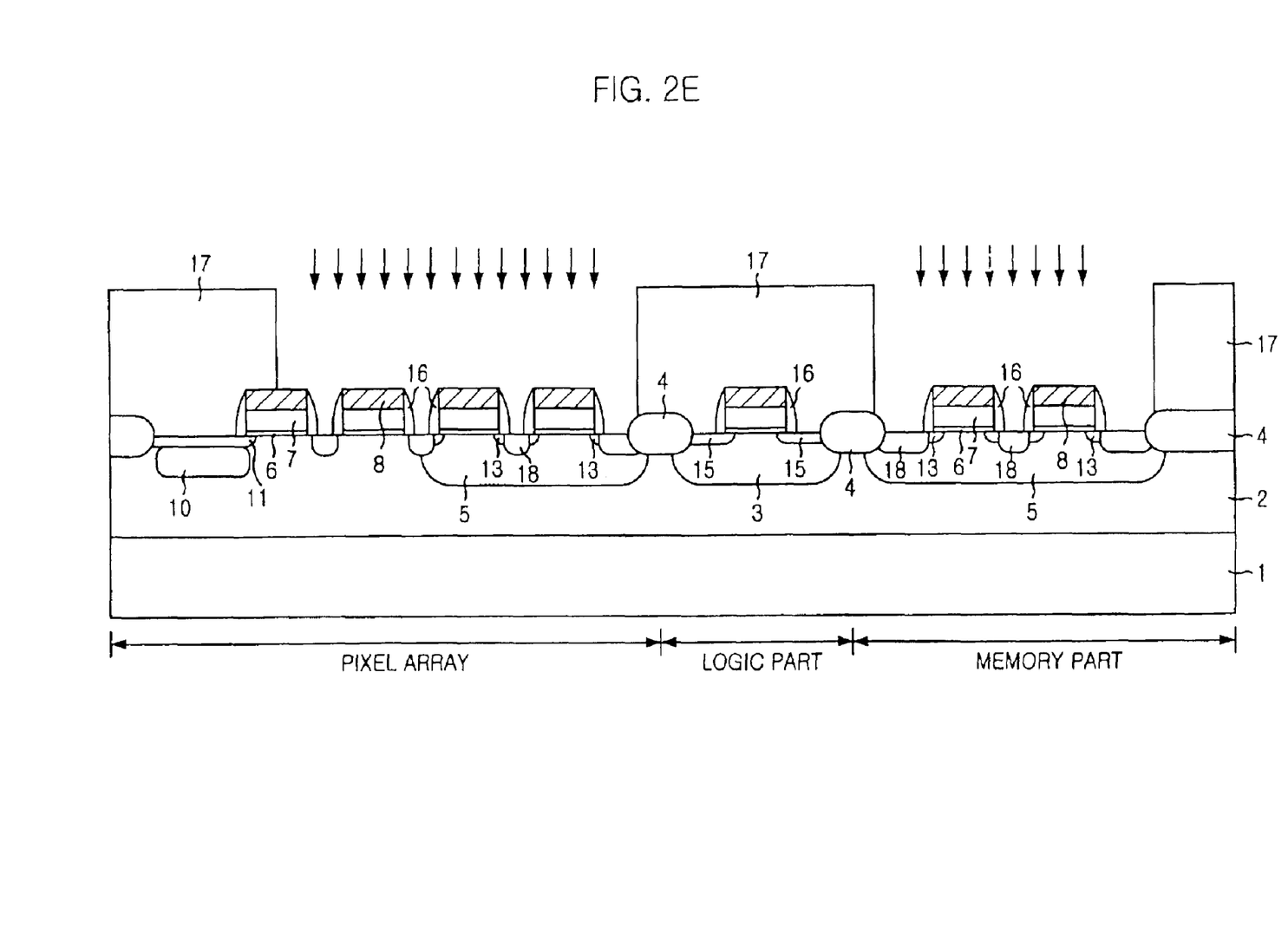

Referring to FIG. 2E, after removing the third photoresist layer pattern 14, a TEOS (tetraethoxysilane) layer is formed by the LPCVD process to a thickness of approximately 2,000 to 2,500 Å on the resulting structure. By anisotropically etching back the TEOS layer, oxide layer spacers are formed on the sidewalls of the gate electrodes. Further, N+ regions 18 for source/drain electrode are formed by forming a fourth photoresist layer 17 covering pinned photodiode region and the CMOS logic part and ion-implanting As atoms in conditions of an energy of approximately 20 to 90 KeV and a dose of 1E15 to 9E15 ions/cm$^2$.

Figure 2F:
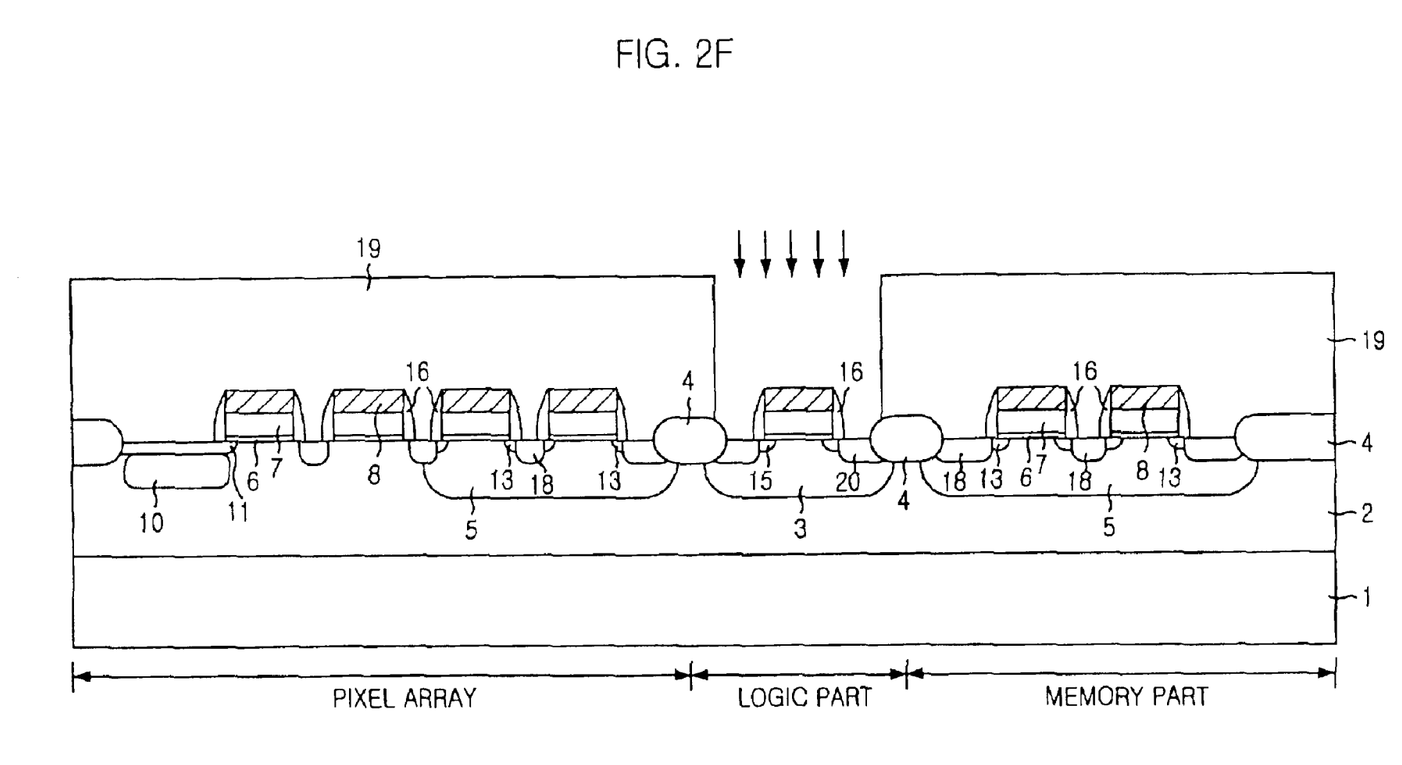

Referring to FIG. 2F, after removing the fourth photoresist layer pattern 17, a fifth photoresist layer pattern 19 opening the N-well 3 is formed on the resulting structure. Then, P$^+$ regions 20 for source/drain electrode is formed by ion-implanting BF$_2$ into the N-well region 3 in conditions of an energy of approximately 20 to 90 KeV and a dose of 1E15 to 9E15 ions/cm$^2$.

Figure 2G:
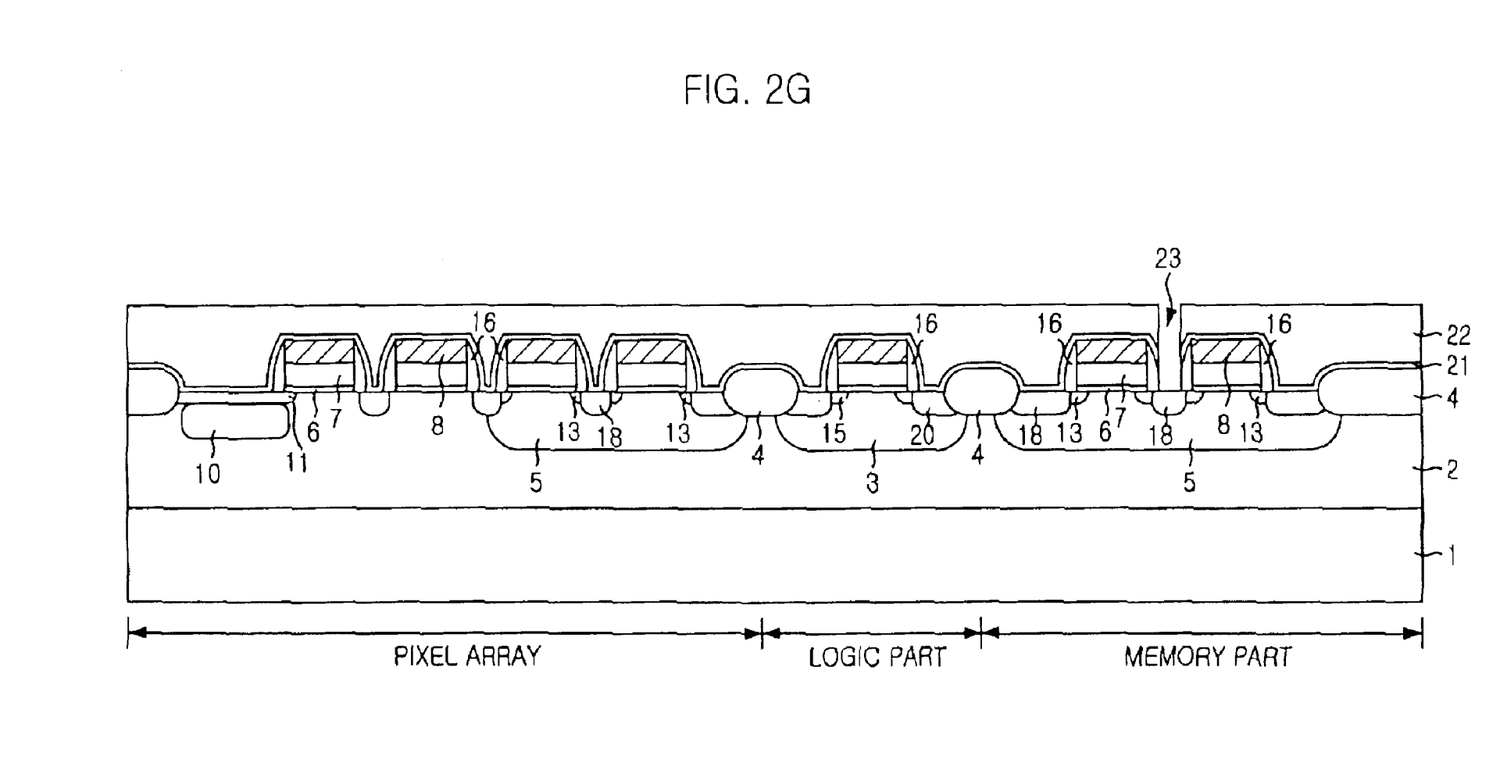

Referring to FIG. 2G, after removing the fifth photoresist layer pattern 19, an oxide layer 21 is deposited on the resulting structure to a thickness of approximately 500 to 1,000 Å and a BPSG (borophosphosilicate glass) layer 22 are deposited on the oxide layer 21 to a thickness of approximately 2,000 to 5,000 Å. Then, a contact hole 23 exposing the source/drain regions of the transistors in memory part is formed in order to connect a bit line to the source/drain regions.

Figure 2H:
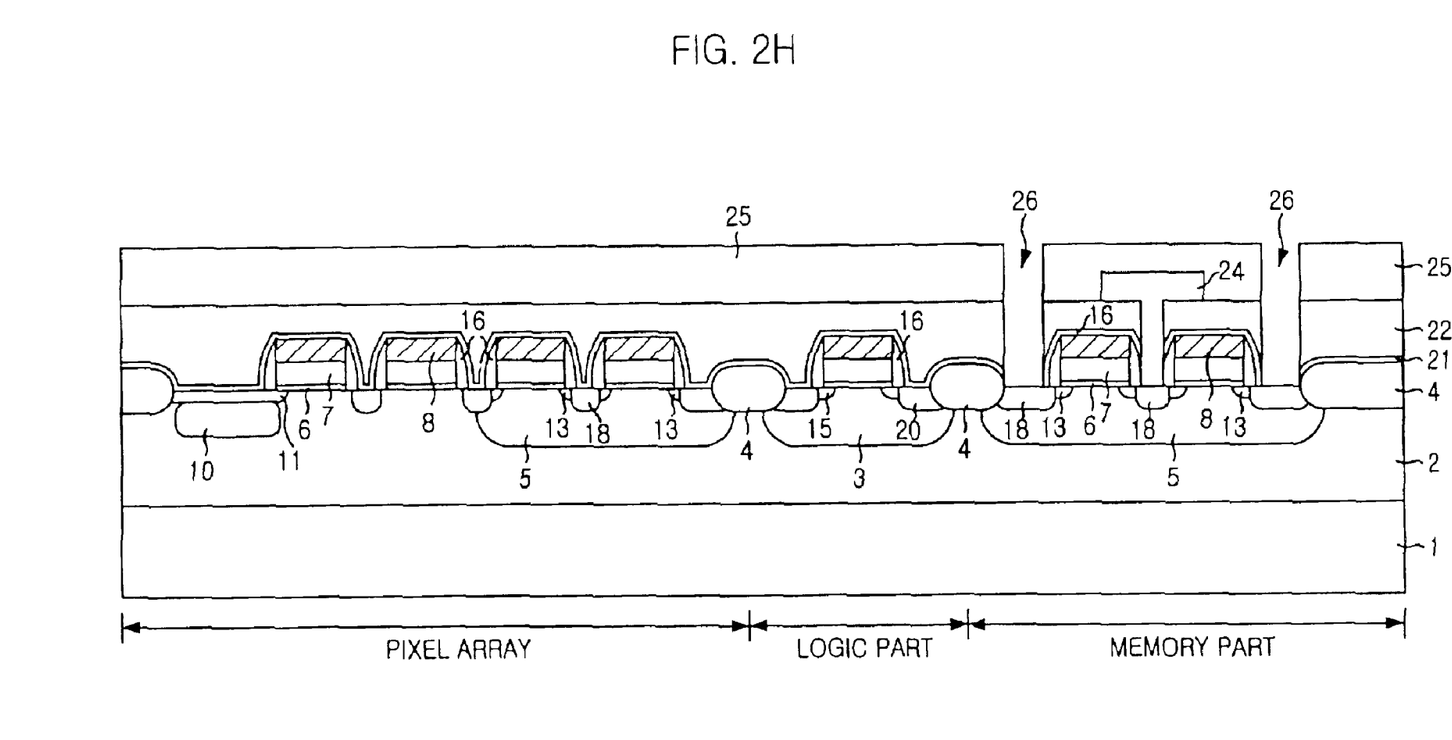

Referring to FIG. 2H, a bit line pattern 24 composed of polysilicon layer having a thickness of approximately 500 Å and a silicide layer (not shown) having a thickness of approximately 1,000 Å is formed first and, next, an interlayer insulating layer 25 having a thickness of approximately 1,500 to 2,500 Å is formed on the resulting structure. Finally, a storage node contact hole 26 for capacitor is formed in memory part.

Referring to FIG. 2I, a storage node 27 of a cylinder type, a dielectric layer 28 and a plate electrode 29 are formed in this order.

Figure 2J:
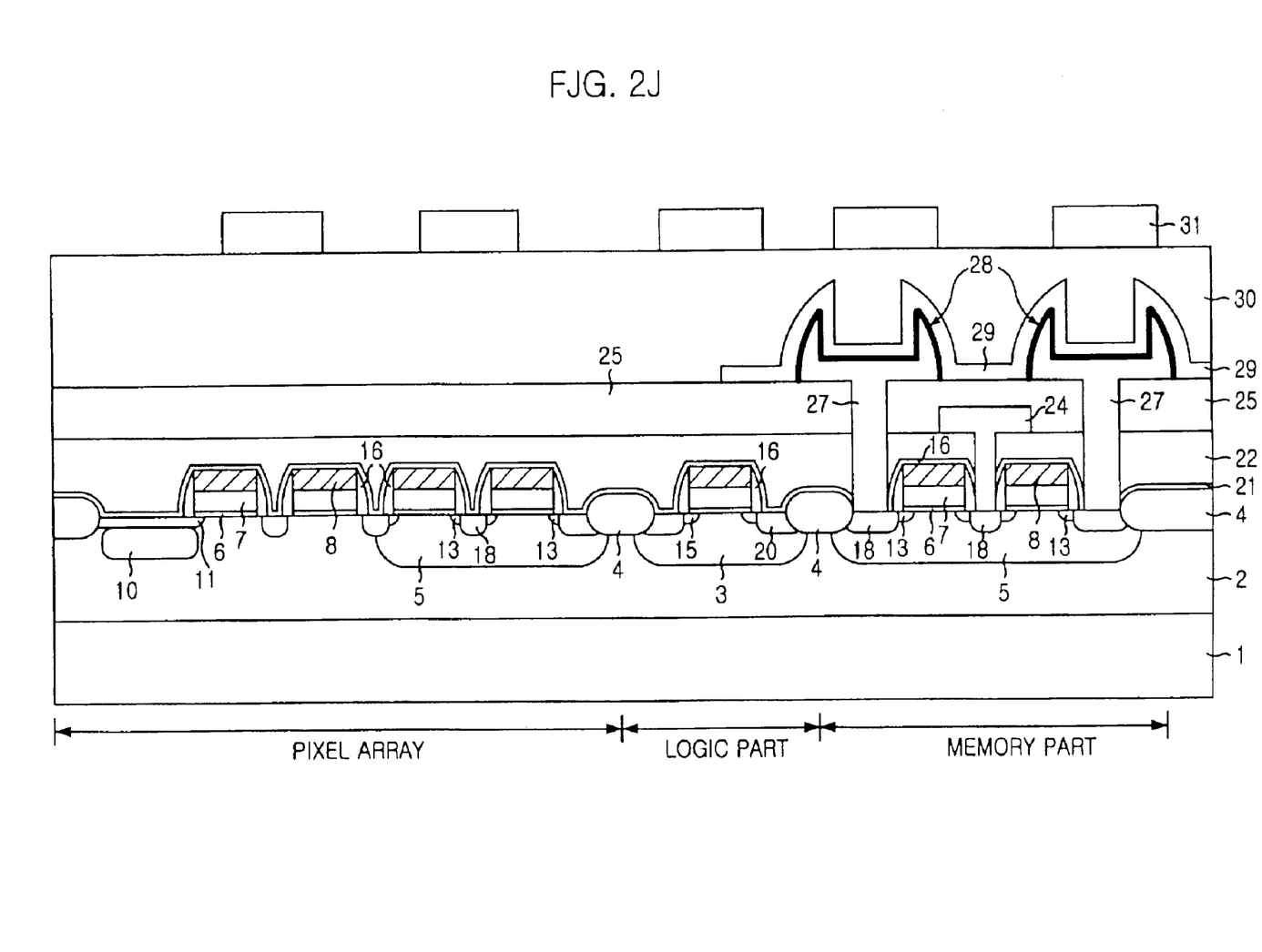

Referring to FIG. 2J, after forming an interlayer insulating layer 30 to a thickness of approximately 13,000 to 15,000 Å on the resulting structure and etching back the interlayer insulating layer 30, metal wires 31 are formed.

As apart from the above, the present invention leads the CMOS image sensor to be integrated together with a memory. Accordingly, the present invention minimizes the CMOS image system.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a CMOS image sensor, comprising the steps of:
    forming in a first dielectrically isolated region of a semiconductor chip a pixel array having a plurality of unit pixels, the pixel array operable to sense light from an object;
    forming in a second dielectrically isolated region of the semiconductor chip a logic circuit operable to process signals from the pixel array; and
    forming in a third dielectrically isolated region of the semiconductor chip a memory structure operable to store electronic data from the logic circuit.

2. The method of claim 1, further comprising the steps of:
    isolating the first dielectrically isolated region from the second dielectrically isolated region; and
    isolating the second dielectrically isolated region from the third dielectrically isolated region.

3. The method of claim 1, wherein the unit pixels comprise a plurality of pinned photodiodes.

4. The method of claim 1, wherein the memory structure comprises a DRAM device.

5. The method of claim 1, further comprising:
    forming a first dielectric-isolation region between a least one of the unit pixels and at least one logic cell that forms a portion of the logic circuit; and
    forming a second dielectric-isolation region between the logic cell and at least one memory cell that forms a portion of the memory structure.

6. The method of claim 5, wherein the first and second dielectric-isolation regions are field-oxide regions.

7. The method of claim 1, wherein forming each unit pixel includes forming a light sensing region and a control transistor in an epitaxial layer.

8. The method of claim 7, wherein forming the light sensing region includes:
    forming an N$^{31}$ well in the epitaxial layer;
    forming a P$^0$ layer above the N$^{31}$ well; and
    forming a control gate coupled to the P$^0$ layer and disposed above the P$^0$ layer.

9. The method of claim 8, wherein:
    the N$^-$ well is formed by ion-implanting phosphorus (P) in the epitaxial layer, and
    the P$^0$ layer is formed by ion-implanting boron difluoride (BF2) above the N$^{31}$ well.

10. The method of claim 7, wherein forming the control transistor includes:
   forming a P well in the epitaxial layer;
   forming first and second lightly-doped source-drain regions in the P well; and
   forming a set of control gates above the first and second lightly-doped source-drain regions.

11. The method of claim 1, wherein forming the logic circuits includes forming at least one logic cell.

12. The method of claim wherein forming the logic cell includes
   forming an $N^{31}$ well in an epitaxial layer;
   forming first and second lightly-doped source-drain regions in the $N^{31}$ well; and
   forming a control gate coupled to the first and second lightly-doped source-drain regions.

13. The method of claim 1, wherein forming the memory structure includes forming at least one memory cell.

14. The method of claim 13, wherein forming the memory cell includes:
   forming a P well in an epitaxial layer;
   forming first and second lightly-doped source-drain regions in the P well;
   forming a set of control gates coupled to the first and second lightly-doped source-drain regions; and
   forming first and second cylinder type storage nodes coupled to the first and second lightly-doped source-drain regions, respectively.

15. The method of claim 1, further comprising:
   forming a first set of isolation regions between the unit pixels and logic cells forming the logic circuit; and
   forming a second set of isolation regions between the logic cells and memory cells forming the memory structure.

16. The method of claim 15, wherein the first and second sets of isolation regions are field oxide regions.

17. The method of claim 1, wherein:
   the first dielectrically isolated region includes a P-well;
   the second dielectrically isolated region includes a P-well; and
   the dielectrically isolated region includes an N-well.

18. The method of claim 1, wherein the semiconductor chip includes an N-type layer formed on a P-type epitaxial layer.

19. A method of manufacturing a CMOS image sensor, the method comprising:
   forming at least one unit pixel in a first region of a semiconductor chip, the unit pixel being configured to sense light;
   forming at least one logic cell in a second regions of the semiconductor chip, the logic cell being disposed adjacent to the unit pixel and being configured to process signals from the unit pixel; and
   forming at least one memory cell in a third region of the semiconductor chip, the memory cell being disposed adjacent to the logic cell and being configured to store signals from the logic cell.

20. The method of claim 19, wherein forming the unit pixel includes forming a photodiode and a control transistor in an epitaxial layer.

21. The method of claim 20, wherein forming the photodiode includes:
   forming an $N^-$ well in the epitaxial layer;
   forming a $P^0$ region overlying the $N^{31}$ well; and
   forming a control gate coupled to the $P^0$ region.

22. The method of claim 21, wherein:
   forming the $N^{31}$ well includes ion-implanting phosphorus (P) in the epitaxial layer; and
   forming the $P^0$ region includes ion-implanting boron difluoride (BF2) above the $N^{31}$ well.

23. The method of claim 22, wherein forming the control transistor includes:
   forming a P well in the epitaxial layer;
   forming first and second lightly-doped source-drain regions in the P well; and
   forming a set of control gates above the first and second lightly-doped source-drain regions.

24. The method of claim 19, wherein forming the logic cell includes:
   forming an $N^{31}$ well in an epitaxial layer;
   forming first and second lightly-doped source-drain regions in the $N^{31}$ well; and
   forming a control gate coupled to the first and second lightly-doped source-drain regions.

25. The method of claim 19, wherein forming the memory cell includes:
   forming a P well in an epitaxial layer;
   forming first and second lightly-doped source-drain region in the P well;
   forming first and second control gates above the first and second lightly-doped source-drain regions; and
   forming first and second cylinder-type storage nodes coupled to the first and second lightly-doped source-drain regions, respectively.

26. The method of claim 19, further comprising:
   forming a first isolation region between the unit pixel and the logic cell; and
   forming a second isolation region between the logic cell and the memory cell.

27. The method of claim 26, wherein the first and second sets of isolation regions are field oxide regions.

28. The method of claim 19, further comprising forming an oxide layer above the unit pixel, the logic cell, and portions of the memory cell.

29. The method of claim 19, further comprising:
   forming a glass layer above the oxide layer;
   forming a first interlayer insulator above the glass layer; and
   forming a second interlayer insulator above thirst interlayer insulator.

30. The method of claim 29, further comprising forming a plurality of metal traces above the second interlayer insulator.

31. A method of manufacturing a CMOS image sensor, the method comprising:
   forming a unit pixel;
   forming at least one logic cell;
   forming a first isolation region between the unit pixel and the logic cell;
   forming at least one memory cell; and
   forming a second isolation region between the logic cell and the memory cell.

32. The method of claim 30, wherein forming the unit pixel includes forming a pinned photodiode configured to sense light and generate an electrical signal thereto.

33. The method of claim 31, wherein forming the unit pixel includes forming a control cell configured to control transfer of the electrical signal to the logic cell.

34. The method of claim 31, wherein the logic cell is configured to selectively transfer the electrical signal to the memory cell, and the memory cell is configured to store the electrical signal.

35. The method of claim 31, wherein the first and second isolation regions are field oxide regions.

36. A method of manufacturing a CMOS image sensor, the method comprising:

forming a plurality of unit pixels;

forming a plurality of logic cells;

forming a first plurality of isolation regions between the unit pixels and respective logic cells;

forming a plurality of memory cells; and forming a second plurality of isolation regions between the logic cells and respective memory cells.

37. A method of manufacturing a CMOS image sensor, comprising the steps of:

forming in a first dielectrically isolated region of a semiconductor chip a pixel array having a plurality of unit pixels; wherein forming the pixel array includes forming one or a plurality of N$^-$ LDD (lightly doped drain) regions, and wherein the pixel array is operable to sense light from an object, forming in a second dielectrically isolated region of the semiconductor chip a logic circuit operable to process signals from the pixel array; wherein forming the pixel array includes forming one or a plurality of P$^{31}$ LDD (lightly doped drain) regions; and forming in a third dielectrically isolated region of the semiconductor chip a memory structure operable to store electronic data from the logic circuit, wherein forming the memory structure includes forming one or a plurality of N$^{31}$ LDD regions.

38. The method of claim 37, wherein forming the memory structure includes:

forming a storage node;

forming a dielectric layer; and forming a plate electrode, wherein in the storage node is layered with the dielectric layer and the plate electrode.

39. A method of manufacturing a CMOS image sensor, comprising the steps of:

forming a pixel array on a chip including forming a plurality unit pixels configured to detect light;

forming a logic circuit on the chip including, wherein the logic circuit is configured to process signals from the pixel array;

forming a memory on the chip, the memory being configured to store output from the logic circuit;

forming one or a plurality of insulating layers layered on the pixel array, the logic circuit, and the memory.

40. The method of claim 39, wherein the insulating layers has a thickness of about 1,500 Å to about 2,500 Å.

* * * * *

UNITED STATES PATENT AND TRADEMARK OFFICE
CERTIFICATE OF CORRECTION

PATENT NO. : 6,949,388 B2
APPLICATION NO. : 10/436564
DATED : September 27, 2005
INVENTOR(S) : Sang Hoon Park

It is certified that error appears in the above-identified patent and that said Letters Patent is hereby corrected as shown below:

Column 6, line 62, delete "30" and insert --31--;

Column 6, line 65, delete "31" and insert --32--; and,

Column 7, line 1, delete "31" and insert --32--.

Signed and Sealed this
Thirteenth Day of November, 2012

David J. Kappos
*Director of the United States Patent and Trademark Office*